(12) United States Patent
Warren

(10) Patent No.: US 7,952,411 B2
(45) Date of Patent: May 31, 2011

(54) PROGRAMMABLE DIGITAL DELAY

(75) Inventor: Robert G. Warren, Bristol (GB)

(73) Assignee: STMicroelectronics (Research & Development) Limited, Buckinghamshire (GB)

( * ) Notice: Subject to any disclaimer, the term of this patent is extended or adjusted under 35 U.S.C. 154(b) by 503 days.

(21) Appl. No.: 11/794,076

(22) PCT Filed: Dec. 16, 2005

(86) PCT No.: PCT/GB2005/004877
§ 371 (c)(1),
(2), (4) Date: Apr. 15, 2008

(87) PCT Pub. No.: WO2006/067393
PCT Pub. Date: Jun. 29, 2006

(65) Prior Publication Data
US 2008/0309392 A1    Dec. 18, 2008

(30) Foreign Application Priority Data

Dec. 24, 2004  (GB) .................................. 0428417.0

(51) Int. Cl.
*H03H 11/26* (2006.01)
(52) U.S. Cl. .................... 327/284; 327/276; 327/277
(58) Field of Classification Search .................. 327/263, 327/276, 277, 284
See application file for complete search history.

(56) References Cited

U.S. PATENT DOCUMENTS

| | | | | |
|---|---|---|---|---|
| 5,357,204 A | * | 10/1994 | Knoll | 327/259 |
| 7,373,571 B2 | * | 5/2008 | Acharya et al. | 714/729 |
| 7,409,416 B2 | * | 8/2008 | Stengel | 708/270 |
| 7,428,722 B2 | * | 9/2008 | Sunkavalli et al. | 716/17 |
| 2004/0012429 A1 | * | 1/2004 | Lindberg et al. | 327/277 |

* cited by examiner

*Primary Examiner* — Long Nguyen

(57) ABSTRACT

A method of delaying successive first and second input signals by first and second different selectable time periods using a programmable delay line comprising a sequence of delay elements, each introducing a delay, the method comprising the steps of: providing a control signal to each delay element, the control signal selectively being in a first logic state or a second logic state wherein in a first logic state the delay element selects an input from an adjacent delay element thereby to select the delay elements as part of a set of delay elements introducing said selectable time period and in a second logic state the delay element is not selected in the set; setting the control signals for a first number of adjacent delay elements to the first logic state to introduce the first selectable time period wherein the control signals for the delay elements in the sequence not in the first number are set to the second logic state; and setting the control signals of a second number of adjacent delay elements to the first logic state to introduce a second selectable time period, wherein the control signals for the delay elements in the sequence not in the second number are set to the second logic state; whereby the reconfiguration time between the first and second input signals is less than the maximum delay introduced by the sequence of delay elements.

20 Claims, 9 Drawing Sheets

PROGRAMMABLE DIGITAL DELAY

CROSS-REFERENCE TO RELATED APPLICATIONS)

The present application is related to British Patent Application No. 0428417.0 filed Dec. 24, 2004, entitled "PROGRAMMABLE DIGITAL DELAY". British Patent Application No. 0428417.0 is assigned to the assignee of the present application and is hereby incorporated by reference into the present disclosure as if fully set forth herein. The present application hereby claims priority under 35 U.S.C. §119(a) to British Patent Application No. 0428417.0.

The present invention relates to a programmable delay line for delaying an input signal by a selectable time period.

Programmable delay lines are widely used on integrated circuit chips for a number of functions, such as adjusting or normalizing circuit timing, supplying instant-startup clocks or multiple clock cycles during a single master clock cycle, and decoding data streams, particularly in telecommunications environments. Such programmable delay lines comprise a number of delay elements and are typically analogue components. By this it is meant that when constructed and analysed at the transistor level paying attention to all resistive, capacitive and other parasitic effects, the signals must be considered as analogue signals. Signalling at the input and output of such components may be purely digital, and an analogue voltage may or may not be used to control the delay, but in any case the internal signals have to be treated and analysed as if they were analogue. Internal construction of these delay lines has to be carefully tuned as will now be explained.

A programmable delay line is typically constructed having a linear sequence of small delay elements and then having a tree of multiplexers to select a given number of these small delay elements. One problem with this approach is that the delay caused by the multiplexer tree is significantly larger than the delay of the small delay elements, often resulting in a lack of monotonicity at the output. This means that the output does not always show an increasing delay as the number of delay elements selected increases. This is because when a different path through the multiplexer tree is selected, delays in the multiplexer tree can vary by more than the delay of each delay element. This is obviously disadvantageous, as it will be difficult to select the correct delay with accuracy when the selection of the output of a greater delay may not in fact provide a greater time delay at the output. Therefore the multiplexer tree has to be very carefully balanced and this is often hard to achieve.

Programmable analogue delay lines using multiplexer trees have to be specially constructed, tuned and implemented; they have to be specially encapsulated to make them compatible with digital design; and construction, tuning, implementation and encapsulation has to be repeated for each variation in technology.

Analogue techniques are generally used to tune the delay line, and these are dependent on the quality of the power supply, and may require a separate power supply with a tighter specification and greater noise immunity. Furthermore, multiplexer trees are relatively large and difficult to place and route on a chip, due to the need to preserve the analogue nature of the component. These cannot be placed and routed optimally on a chip using an automatic tool, but rather present an obstruction which other digital cells and routing must work around. Furthermore, multiplexers in this configuration use a relatively large chip area, and due to the pyramid structure of the circuit, a designer has little freedom as to how this circuit is laid out.

U.S. Pat. No. 6,222,407 describes a programmable delay line which has identical pairs of positionally corresponding delay stages in parallel arrays. The pairs of delay elements include identical arrangements of circuit elements and are replicable in step-and-repeat fashion so as to allow any arbitrary maximum delay time to be provided. Delay stages of the delay line comprise multiplexers. The function of the delay line is to correct and synchronise propagation times of digital signals and for this purpose a set of latches is used to receive and latch a signal transition to which the delay line is to be matched. These latches allow rapid setup of the delay line to be achieved. The intention is, that once the delay line has been set up, it will introduce the same delay each time it receives a transition. It is intended that the delay line will need to be reprogrammed (or reset) only when there is detection of an error in synchronisation.

Reference is also made to U.S. Pat. No. 6,525,585 which describes a fixed length delay generation circuit. The aim of this circuit is to provide a fixed length delay in the face of changes in manufacturing conditions or environmental changes. A variable delay circuit is used as part of the fixed length delay generation circuit to accommodate variations.

Neither of these documents address the problem in applying a delay line in a situation where the delay to be introduced by the delay line needs to be changed between successive transitions or incoming edges. In particular, the change in delay needs to be reliably quickly accomplished.

It is an aim of embodiments of the present invention to at least partially address these problems.

According one aspect of the present invention there is provided a programmable delay line arranged to delay successive first and second input signals by first and second different selectable time periods, said first and second successive input signals being received at an input of the delay line wherein the delay line has an output for outputting the delayed input signals and comprises a sequence of delay elements each introducing a delay and having selection means arranged to receive a control signal, the control signal selectively being in a first or a second logic state wherein in a first logic state the delay element selects an input from an adjacent delay element thereby to select the delay elements as part of a set of delay elements introducing said selectable time period and in a second logic state the delay element is not selected in the set, the delay line further comprising means for resetting the control signals from the first to the second logic state in a reconfiguration time which is less than the maximum delay introduced by the sequence of delay elements.

The set of delay elements could be any number of delay elements selected from the sequence, for example only one delay element, or one hundred delay elements. It will be readily appreciated that any number of delay elements could be provided in the sequence of delay elements, depending on the maximum delay required, the only limiting factor being chip area on which the circuit is to be implemented.

According to one embodiment of the present invention, the delay is provided by an outward path and a return path for the input signal through the delay element. Furthermore, in embodiments of the present invention the delay at the output, which is equal to the selectable time period, is provided by an outward path and a return path through the set of delay elements.

The programmable delay according to embodiments of the invention is not an analogue component as described above, but uses smaller digital cells that an automatic tool can place and route optimally. This provides advantages over analogue solutions which can be difficult to integrate with other digital circuitry. The advantages of embodiments of the present invention over analogue components are therefore that the programmable delay circuit can be smaller, compatible with digital automation, and they do not provide an obstruction for placing and routing. Furthermore, in embodiments of the invention monotonicity can be guaranteed. Furthermore, separate analogue power supplies are not required, and instead a common power supply can be provided.

According to another aspect of the present invention there is provided a method of delaying successive first and second input signals by first and second different selectable time periods using a programmable delay line comprising a sequence of delay elements, each introducing a delay, the method comprising the steps of:

providing a control signal to each delay element, the control signal selectively being in a first logic state or a second logic state wherein in a first logic state the delay element selects an input from an adjacent delay element thereby to select the delay elements as part of a set of delay elements introducing said selectable time period and in a second logic state the delay element is not selected in the set;

setting the control signals for a first number of adjacent delay elements to the first logic state to introduce the first selectable time period wherein the control signals for the delay elements in the sequence not in the first number are set to the second logic state; and setting the control signals of a second number of adjacent delay elements to the first logic state to introduce a second selectable time period, wherein the control signals for the delay elements in the sequence not in the second number are set to the second logic state;

whereby the reconfiguration time between the first and second input signals is less than the maximum delay introduced by the sequence of delay elements.

One application of the programmable delay discussed in the following is an a pulsed serial link which is a novel method of encoding data and the subject of our copending Application No. 0428422.0, (PWF Ref 307320) and described more fully below.

Another application of the programmable delay discussed herein is in an SDRAM DDR (synchronous dynamic random access memory, double data rate) interface.

The logic for interfacing SDRAM DDR memory with a memory controller preferably includes the generation of all relevant clocks to prevent timing violation both on and off chip. Read and Write circuitry will be timed according to the DDR standard, and there will be principally three distinguishable clock domains, the memory controller clock domain, the writing clock domain, and the reading clock domain. When data is transferred between the read or write clock domain and the memory controller clock domain, retiming of the data signals is required. The read logic and write logic in the interface includes one or more delayed locked loops (DLLs) for generating timing signals for retiming data read or to be written to the memory. Programmable delay lines discussed herein may be used in such DLL circuits.

The DDR standard provides for data strobe signals which are returned along with each byte of read data when data is being read from the DDR memory. During a succession of clock cycles when data is being read, the data strobe, for a particular byte, rises near the beginning of the clock cycle as one byte of data is presented, and falls near the mid point of the clock cycle as the next byte of data is presented (hence "double data rate" because data changes twice in each clock cycle). The optimal time to sample or capture a particular read data byte is one quarter of a clock cycle, of the clock supplied to the DDR memory, after each edge of the data strobe associated with that byte. Since the clock supplied to the DDR is generated on-chip from a PLL (phase locked loop) or other means, such as dividing down a higher speed clock, the quarter (or 90 degrees) phase shifted variant of the supplied clock is also made available. The time delay between the clock and its phase shift variant is the reference delay for which an equivalent delay is required to delay each data strobe.

Although the delay through any programmable delay, for any given selection, can vary enormously across process, voltage and temperature variations, the delay through each of several programmable delays in close proximity on-chip will be very similar for any given delay selection. Therefore, one PDL is used in a delay locked loop, for which the program setting is continuously tuned to match the quarter phase reference delay. Then as many separate further PDLs as are required for each byte of read data are programmed with the same setting and used to delay the data strobes associated with each read data byte. These delayed data strobes are then used to capture the associated bytes of read data.

For a better understanding of the present invention and to show how the same may be carried into effect, embodiments of the invention will now be described by way of example with reference to the accompanying drawings, in which.

Figure 1:
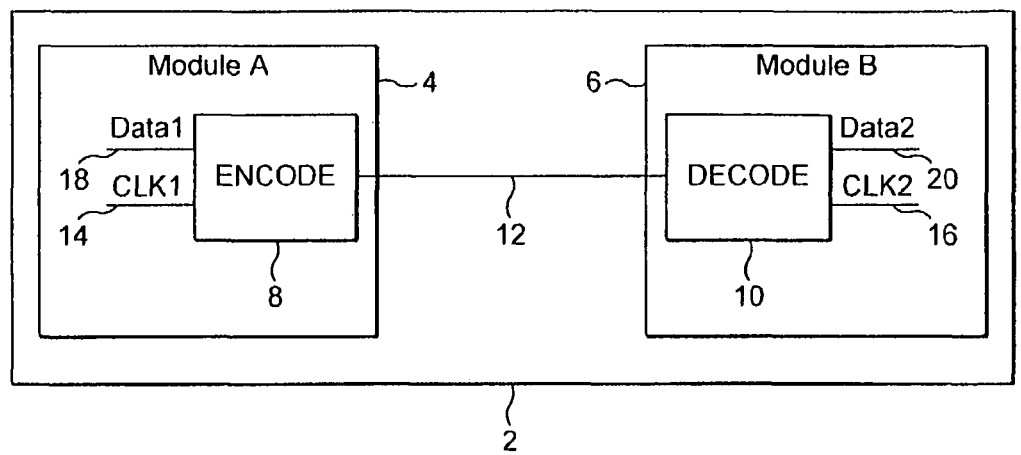
FIG. 1 shows circuitry for communication between two modules on an integrated circuit in which embodiments of the present invention can be incorporated.

FIG. 1 shows circuitry in which data is to be transmitted between a module A, labelled 4 in FIG. 1 and module B, labelled 6 in FIG. 1, both modules being on an integrated circuit 2. Although modules A and module B are illustrated as being on the same chip, it will readily be appreciated that the principles discussed in the following can be implemented in a number of different environments, in particular in a situation where the communicating modules are on different ICs. In prior art embodiments, a parallel bus with separate clock distributed to both modules may have been used between modules A and B in order to transmit data and time information. In such systems the clock frequency must be low enough to allow clean synchronous communication across the plurality signal wires comprising the parallel bus. In order to increase the bandwidth (number of bits of useful communication per second) of the system, the number of wires is increased. Alternatively, in typical asynchronous communications, for example in the RS232 serial port, a single wire carries the bit information which is clocked at a specified clock rate. The two clocks, one in the transmitter, and one in the receiver, are independent and asynchronous in both phase and frequency, but are both within the specified tolerance range. This asynchronous arrangement is typically further refined by continuously adjusting, adapting or locking the receive clock to closely match the characteristics of the transmit clock by inference from the edges in the received data. Nonetheless, the two clocks are independent and hence described as asynchronous.

Serial communications links have a number of problems. They have relatively high latency due to resynchronisation requirements at the destination module. Bandwidth is limited due to the tolerance range specified above. In alternative serial connects where a clock is transmitted alongside data, bandwidth will also be limited by tolerances imposed because of timing variations between the signals. Serial links are also costly due to the requirement of generating the necessary high speed encoding and sampling clocks. Encode and decode blocks for serial links also require complex logic, especially if analogue techniques are employed.

According to the embodiments such as the embodiment shown in FIG. 1, a single wire 12 is used between modules A and B to transmit data and timing information. In order to achieve this, a data signal DATA1 on line 18 is encoded by an encode block 8 with a clock signal CLK1 received on line 14 before being transmitted on line 12. A decode block 10 decodes the signal on line 12, to retrieve the data signal, now labelled DATA2 on line 20, and the clock signal CLK2 on line 16. According to this embodiment, CLK1 will have the same frequency as CLK2, however the phase relationship between these clocks is indeterminate.

The system of FIG. 1 can be described as GALS (globally asynchronous, locally synchronous) as will now be explained. Module A includes logic (not shown) clocked by CLK1 which generates the data signal DATA1 on line 18, and module B includes logic clocked by CLK2 which receives the data signal DATA2 on line 20. The logic in Modules A and B is synchronous in that it is clocked by CLK1 and CLK2 respectively. However, as CLK1 is not in phase with CLK2, modules A and B can be said to be asynchronous. Therefore, globally the circuit is asynchronous.

A system for encoding data and timing information onto a single connection 12 will now be described with reference to FIGS. 2 to 5. The underlying principle of the system will be described first with reference to FIG. 2.

Figure 2:
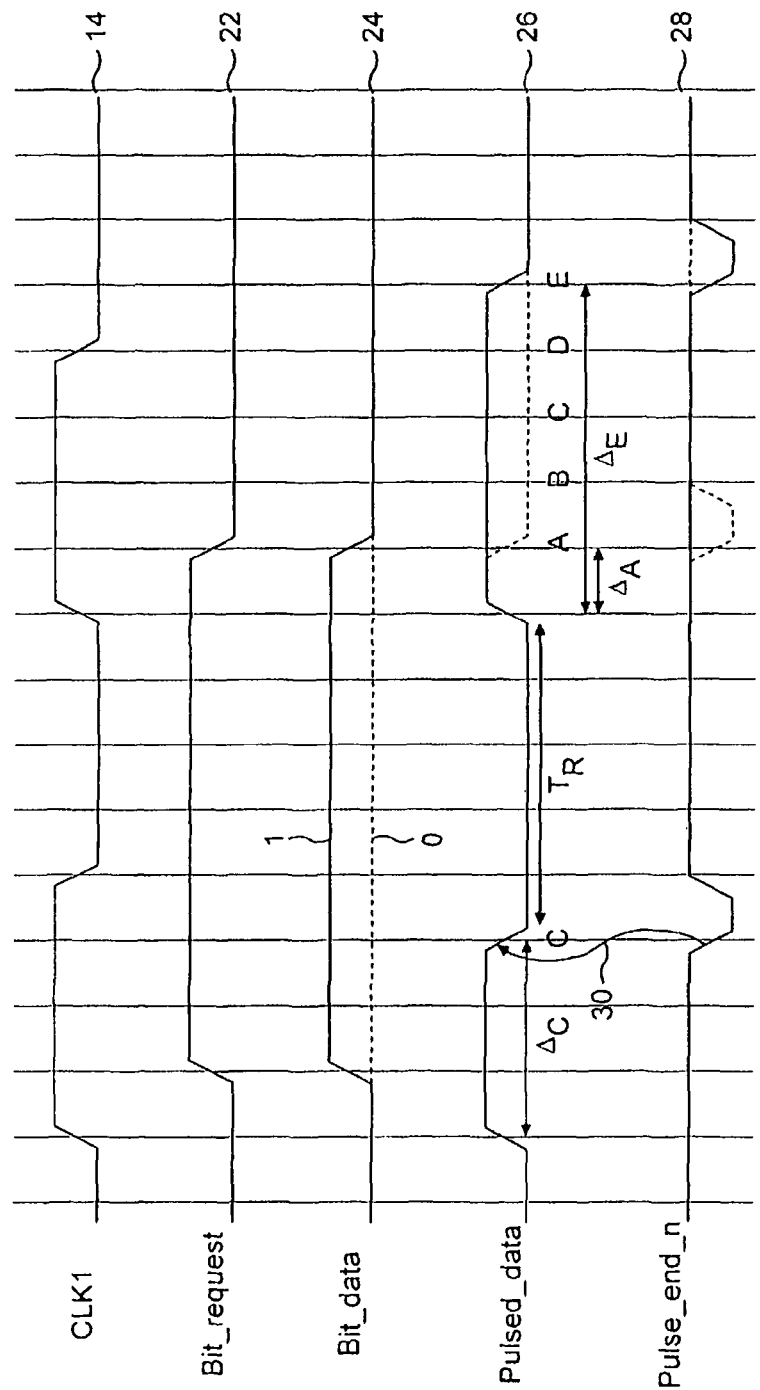
FIG. 2 shows data and timing signals encoded according to one example of a pulsed serial link as described in our copending Application No. 0428422.0 (PWF Ref 307320)

FIG. 2 shows timing diagrams for clock signal CLK1 14, a bit_request signal 22, bit_data signal 24, a pulsed_data signal 26, and a pulsed_end_n signal 28. The frequency of this clock signal is, for example 100 MHz, however clock frequencies used in other embodiments could be any clock frequency that would work given the particular environment.

Bit_request signal 22 is a common signal used in conjunction with data signals, and when this signal is high, this indicates that the data on bit_data signal 24 is valid.

The bit_data signal 24 indicates the data value whilst bit_request signal 22 is high. The bit_data value transmitted by bit_data signal 24 could be a '1' or '0', represented by a high or low signal: both possibilities are shown in FIG. 2.

According to embodiments described herein, the clock signal CLK1, bit_request and bit_data signals are all encoded into a single signal. This is shown as pulsed_data signal 26. The rising edges of pulsed_data signal 26 occur immediately following rising edges of clock signal CLK1. Therefore, the pulsed_data signal 26 is still valid as a clock signal for any sequential logic clocked by the rising edge of said pulsed_data signal. When this signal is received by module B, the clock signal may be used not only for allowing the retrieval of the encoded data (discussed later), but also for use as a local clock, after suitable buffering, in module B. The buffering delays the clock to produce CLK2 used by the logic in module B and, thus CLK2 must be treated as a separate clock from that used directly for decoding.

As shown by the example illustration of signal 26, data is encoded into the falling edge of the clock signal which can be transmitted on a single wire (line 12 in FIG. 1). This is achieved by altering the timing of the falling edge depending on the data. In the case that at the time of the first rising edge of CLK1 14, the bit_request was low, this indicates there is no valid data to send. This is indicated by the first falling edge of the pulsed_data signal 26 falling at point C, a predetermined delay $\Delta_c$ from the rising edge.

At the second rising edge of CLK1 14, bit_request signal 22 is high, indicating that there is data on bit_data signal 24. In this case, if the data is a '0', the falling edge will be at time A, a delay $\Delta_A$ from the rising edge, and if the data bit is a '1', the falling edge will be at time E, a delay $\Delta_E$ from the rising edge. In this way data is encoded onto the clock signal. In this embodiment, timing locations B and D (at respective delays $\Delta_B$, $\Delta_D$ from the rising edge) are used when decoding the encoded signal, as will be explained in more detail below.

Figure 2A:
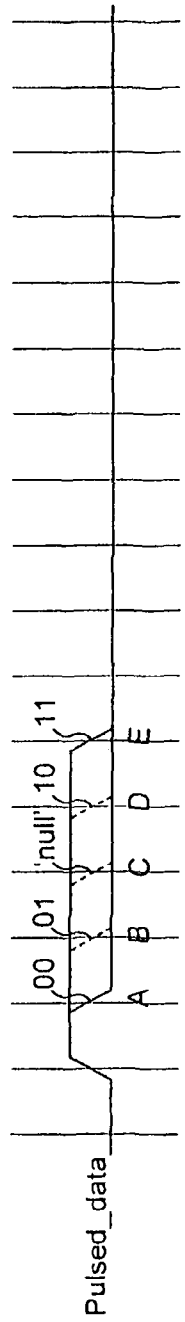
FIG. 2A shows the pulsed_data signal in another example of a pulsed serial link.

In this example, the request and one bit of data has been encoded onto three possible positions of the falling edge of the clock signal. Thus effectively 3 input bits (clock, request and one bit of data) have been encoded onto a single wire with only 3 variations per period where normal binary logic would require 8 variations for 3 bits. However, the clock does not represent a full binary bit because it is only the rising edge that is of interest. Also, the combination of request and data does not represent two full binary bits because the data is irrelevant when there is no request. In alternative arrangements a single wire with only two or any number more than three possible positions of the falling edge of the clock signal could be used. Such alternative arrangements could be used to encode one, two, three, four or more data bits into each falling edge. Also, as described in more detail below, one or more control functions could be encoded into each falling edge. This would require more, or less, possible timing locations for the falling edge. For example, consider the pulse shown in FIG. 2A, where falling edge location A denotes 00, falling edge location B denotes 01, falling edge location C denotes a null, falling edge location D denotes 10 and falling edge location E denotes 11. It will be apparent when the encoding and decoding circuitry is described below that slight modification to this circuitry would allow a greater number of bits to be transmitted on each falling clock edge. The only limiting factor in the amount of information that can be transmitted is the accuracy of the delay circuitry delaying the falling edges, and the accuracy of the detecting circuitry for detecting the timing of the falling edges in the decode block. However, it is important to note that absolute accuracy of delay elements in encode and decode circuits is not important, only their accuracy in respect to each other.

Another important factor in the amount of information that can be transmitted is the reset or reconfiguration time in between successive pulses, denoted $T_R$ in FIG. 2. If this is greater than half a clock period, the limit on data rate is affected by $T_R$ rather than the clock frequency: in fact it is $T_R + \Delta_E$.

Finally, the pulsed_end_n signal 28 shown in FIG. 2 is a signal that occurs in the encode circuit during the encoding of the data and clock, and this signal will be referred to in relation to the operation of the encoding block.

There are numerous advantages with pulsed serial link described above. This is a genuine single wire connection, with clock, data and data valid encoded on one line. As described below, the encode and decode blocks can be purely digital. Bandwidth is used efficiently. High speed clocks are not required, and nor are analogue techniques. There is also no requirement for an isolated power supply. The logic required for encoding and decoding is minimal, and for higher bandwidth utilisation, the amount of logic scales proportionately. Furthermore, if the clock is stopped during periods when no data is being transferred, the link is power efficient. In the circuit of FIG. 1, when CLK1 is stopped, CLK2 is also stopped and hence all of the logic in module B no longer consumes power.

Figure 3:
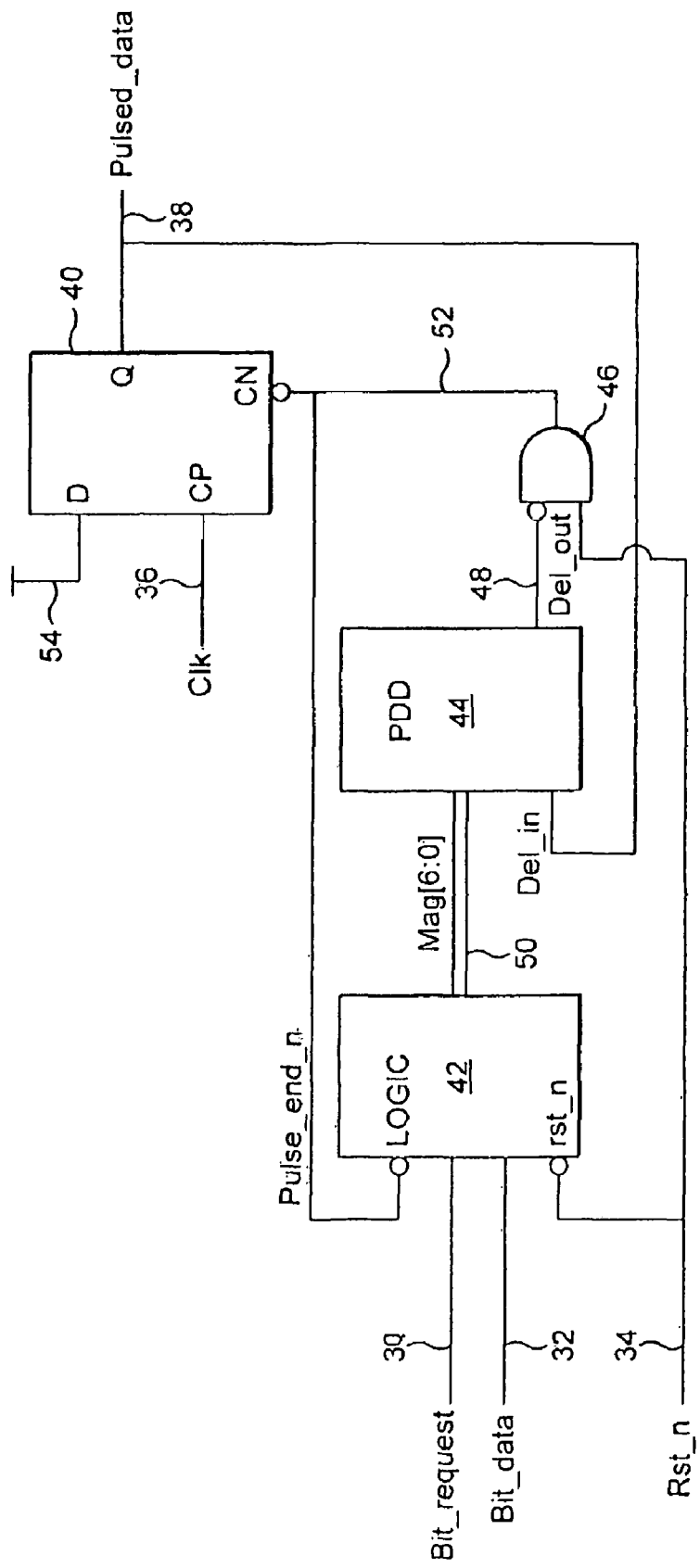
FIG. 3 shows encoding circuitry for encoding data in a pulsed serial link.

FIG. 3 shows encode circuitry according to one embodiment. As shown in FIG. 3, the bit_request signal is provided on line 30, the bit_data signal is provided on line 32, the clock signal is provided on line 36, and a reset signal, rst_n, is provided on line 34. During normal operation of the encoder circuitry, the reset signal, rst_n, on line 34 will be high, allowing the circuit to function normally. The reset signal, rst_n, is asserted low during power up and in other situations to ensure a clean initial state across the system on chip (SoC). However, in alternative embodiments other initialisation techniques could be used which do not require this form of reset signal.

The encoder circuitry comprises a D-type flip-flop 40, logic block 42, a programmable digital delay (PDD) block 44, and AND gate 46. The pulsed_data output signal 26 is provided at the output of flip-flop 40 on line 38. The signals bit_request and bit_data on lines 30 and 32 are connected to inputs of the logic block 42. The reset signal, rst_n, on line 34 and a pulsed_end_n signal 52 from the output of the AND gate 46 are also connected to inputs of the logic block 42. Based on the values of bit_request and bit_data, and also the values of the rst_n signal and the pulse_end_n signal, the output of logic block 42 labelled 50 is determined.

In the present embodiment, the output of logic block 42 will be a series of control lines 50, in the form similar to a one hot encoding, which control circuitry in the PDD block 44. One hot encoding is a scheme known to those skilled in the art that allows the complexity of system design to be minimised. There are seven control lines in the embodiment shown in FIG. 3, labelled Mag(0) to Mag(6), and on each line a '0' or a '1' may be asserted, with the only legal combinations being all 0's or a continuous run of 1's across any number of Mag(0), Mag(1) through to Mag(6) respectively. For example, if Mag(4) is asserted, then lines Mag(3) to Mag(0) must also be asserted.

The number of these control lines that are asserted high determines the magnitude of the delay Δ of the programmable digital delay block 44 between its input signal, del_in connected to 38 and its output signal, del_out, connected to 48. Seven control lines are provided is this embodiment, which allow reset plus seven different delay values to be selected. The first such selection, when all control lines 50 are zero, is used when in the defined initial condition for the circuit, which is when rst_n is asserted low. The second such selection, when only mag(0) is '1', is the minimum delay, used to control the width of the low going pulse of pulsed_end_n on line 52, as explained in more detail below. Five of the remaining different delay values allow the five delays $\Delta_A$ to $\Delta_E$ to be selected.

The programmable digital delay block 44, which is connected to logic block 42 by connection 50, receives the magnitude control signals Mag(0) to Mag(6), and also receives the pulsed_data signal on line 38 from the flip-flop 40. The PDD 44 determines the timing of the falling edge of the pulsed_data signal on line 38. The inverted output of PDD 44 on line 48 is connected to one input of two input AND gate 46. The second input of AND gate 46 is connected to the reset signal rst_n 34. The output of AND gate 46 on line 52 is connected to a not reset input CN of D-flip flop 40, which causes an asynchronous reset of the flip-flop when line 52 is low, independent of the clock input CP 36. This output on line 52 is also connected to logic block 42.

In alternative embodiments, the magnitude of the delay through the PDD 44 may be controlled by any encoding scheme which is different from the one-hot encoding scheme described above, such as straight binary, gray-code, mixed course plus fine, or any encoding to suit the range and selection of the programmable delays required.

Logic block 42 will output low signals on all of the control lines if the reset signal on line 34 is low, irrespective of values on other inputs.

If rst_n is high, and the pulsed_end_n signal on line 52 is low, then according to the present embodiment, Mag(0) will be asserted high, and all the other control signals will be low, irrespective of the values of bit_request and bit_data. This will select the smallest time delay from the PDD block 44, used to control the width of the low going pulse of pulsed_end_n on line 52.

If rst_n is high, pulsed_end_n is high, and bit_request signal 22 on line 30 is low, then this indicates that there is no data, and control lines Mag(4), Mag(3), Mag(2), Mag(1) and Mag (0) will be asserted high by logic block 42, and the rest of this magnitude signal will be controlled to be low. This will result in a delay value being programmed in the PDD block 44 equal to delay $\Delta_C$ shown in FIG. 2. It should be noted that this delay is calculated from the rising edge of the pulsed_data signal 26.

If on the other hand the bit_request signal on line 30 is high, then the values on the control lines will depend on the data bit to be transmitted. If bit_data signal on line 32 is a '0' (low), control lines Mag(2), Mag(1) and Mag(0) will be asserted high and the rest of the control lines will be low. This would control the PDD block 44 to give a delay equal to $\Delta_A$. If the data bit is a '1' (high), then all of the control lines Mag(6) to Mag(0) will be asserted, giving the greatest possible delay. This would control the PDD block 44 to give a delay equal to $\Delta_E$.

In practice, because the delays through components 40, 42 and 46 in FIG. 3 are significant with respect to the individual delay steps of PDD 44, then the actual width of the pulsed_data high pulse will be different from the programmed delay through PDD 44. However, since the delay steps of the programmable delays in the decoder match the delays steps of PDD 44 in the encoder to an acceptable tolerance, then any implementation offset can be compensated at the design stage in either encoder or decoder.

Operation of the encoder circuitry of FIG. 3 will now be described with reference to the timing diagrams in FIG. 2. As explained above, flip-flop 40 provides the pulsed_data output on line 38. The D input to this D type flip-flop is connected to line 54, which is connected high (logic '1'). Therefore whenever the clock input on line 36 goes high, output Q of the D flip-flop will go high shortly afterwards. However, the reset input of the D type flip-flop 40 is connected to line 52. This reset input is inverted, and therefore whenever the pulse_end_n signal on line 52 goes low, the output of the flip-flop will be reset to 0. The timing of this reset determines the timing of the falling edge of the pulsed_data signal 38.

As shown in FIG. 2, shortly after the first rising edge of CLK1, the pulsed_data signal goes high. This is because the high input at the D input of flip flop 42 is clocked by CLK1, and output at the Q output of the flip flop. Note that the pulse_end_n signal on line 52 is high, and therefore the D flip flop is not being reset.

The rising edge of the pulsed_data signal will arrive at the PDD block 44, and the time delay provided by this block will be determined by the values of the control signals Mag(6) to Mag(0). These signals are provided by logic block 42, and as the reset signal, rst_n, is high and the pulsed_end_n signal is high, but the bit_request signal 30 is currently low, magnitude control lines Mag(4) to Mag (0) will be asserted high, and the other lines will be low. This means that the output of a programmable digital delay block 44 will rise at time C, which is a certain delay after the rising edge of the pulsed_data signal, controlled by the programmable digital delay circuitry.

The rising edge of the delay block output on line 48 will cause the pulse_end_n signal on line 52 to go low, as the signal at the inverted input of AND gate 46 will now be high. The falling edge of the pulsed_end_n signal 28 in FIG. 2, on line 52 will in turn cause the flip-flop 40 to reset, causing the pulsed_data signal fall to 0 at time C, very shortly after the delayed rising edge at the PDD output. This is shown in FIG. 2 by arrow 30.

The falling edge of pulsed_data signal on line 38 will also arrive at the input to the programmable digital delay. This time, the control signals provided by logic block 42 will be different. This is because the pulsed_end_n signal is now low, and in this situation, as explained above, only Mag(0) is asserted high, and the remaining control signals are asserted low. This provides the minimum delay step through PDD 44. Therefore, following this minimum delay after the falling edge of pulsed_data, the pulsed_end_n signal will return to high, releasing the asynchronous inverted clear input to flip-flop 40 again. However, it will not be until the next rising edge of clock signal 36 that the activation of the flip-flop 40 is noticed at the output. Note that a minimum delay is used for the low width of pulsed_end_n 52, but if implementation analysis revealed any timing hazard, then this minimum delay could be increased by one or more steps.

On the next rising edge of CLK1, once again the pulsed_data output on line 38 will go high. This rising edge will arrive at the programmable digital delay block 44. This time reset, rst_n, and pulsed_end_n are both high, and bit_request is also high. Therefore the control signals 50 will be determined by the bit_data signal on line 32.

As mentioned above, if the data bit were a '0', then control signals Mag(2) to Mag(0) would be asserted, and if the bit_data value were a '1', then control signals Mag (6) to Mag(0) would be asserted. In the case of a '0' bit, the pulsed_end_n signal will fall at time A. This would then reset the D flip-flop 40 and cause the pulsed_data output 38 to drop shortly after point A. The falling edge of the pulsed_end_n signal on line 52 would cause logic 42 to then assert only control signal Mag(0), providing the minimum delay until the pulsed_end_n signal rises again.

Alternatively, if the data bit on line 32 were a '1', then the pulse_end_n signal would fall at time E, causing the D flip-flop 40 to reset and pulsed_data signal 38 to fall. Again, the falling edge of the pulsed_end_n signal on line 52 will cause logic 42 to assert only the control signal Mag(0), meaning that the pulsed_end_n signal will rise again after the minimum delay step.

PDD 44 is used to control the high width of pulsed_data via bit_request 30 and bit_data 32, and is also used to control the low width of pulsed_end_n 52. It is important that this minimum width of pulsed_end_n low is controlled in order to avoid asynchronous timing problems which could be induced if pulse_end_n 52 was allowed to merely to glitch low. A minimum delay value is used here, rather than no delay at all, as if implementation analysis reveals any timing hazard, the minimum delay may be increased by one or more steps.

Another subtlety of this design is the property that pulsed_end_n input to 42 causes the designated minimum delay code to be set on 50. The design of the PDD 44 is such that all 1's which may be residual in the PDD, as a consequence of a long pulsed_data high pulse width to encode a requested bit_data value of 1, are cleared by the selection of this minimum delay. This means that the next rising clock edge on 36 can occur shortly after the minimum delay following the latest falling edge of pulsed_data. If this were not the case then the next clock edge could not safely occur until after pulsed_data had been low for the maximum delay.

The pulsed_data signal on line 38 will be transmitted via line 12 to module B, where it will be decoded by a decode block 10. Decoding of the pulsed_data signal will now be described with reference to FIGS. 4 and 5.

Figure 5:
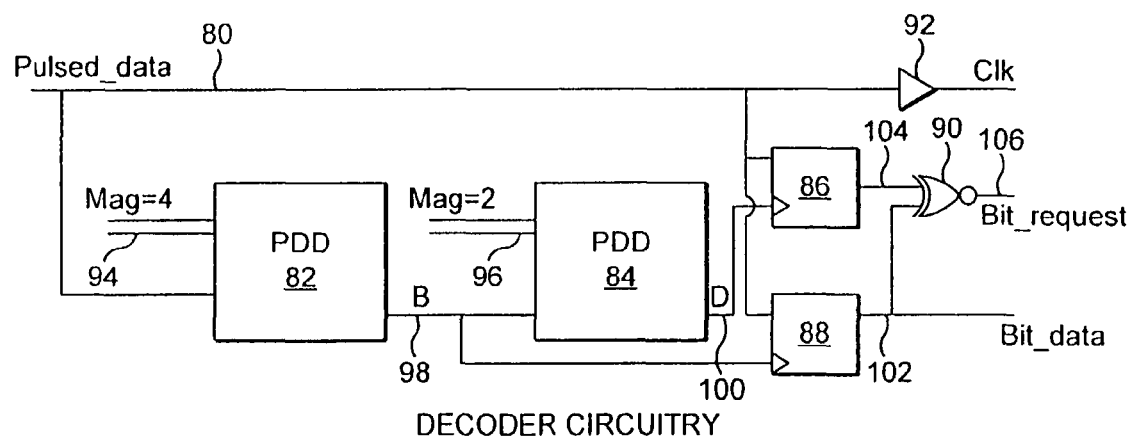
FIG. 5 shows decoding circuitry for decoding data and timing signals from the encoded signal of FIG. 3.

FIG. 5 shows decoder circuitry. Two programmable digital delay blocks are provided labelled 82 and 84. The output of the programmable digital delay block 82 is connected to the clock input of a first D flip-flop 88. The output of the second programmable digital delay block 84 is connected to the clock input of a second D flip-flop 86. The pulsed_data signal is input on line 80 and provided to the input of the PDD block 82. The output of PDD 82 is provided to the input of the PDD 84. Alternative arrangements might implement a single digital delay, which does not need to be programmable, but provides output taps equivalent to magnitudes 4 and 6 respectively.

The output of D flip-flop 88 provides the bit_data signal. The output of the flip-flop 86 on line 104 is connected to one input of a two input exclusive NOR gate 90. The second input of the exclusive NOR gate 90 is connected to the output of flip-flop 88. The output of exclusive NOR gate 90 on line 106 provides the bit_request signal.

The clock is also retrieved from the pulsed_data signal having been passed through a Buffer 92. As described above, the clock is preferably used to clock logic in the destination module. A clock tree would be used to distribute the clock to this logic, and Buffer 92 is provided to drive the clock tree loading. A greater number of buffers may be required for this purpose. It should be noted that there may be a significant delay, possibly more than one period of the clock, in propagating the clock through such a clock tree.

Figure 4:
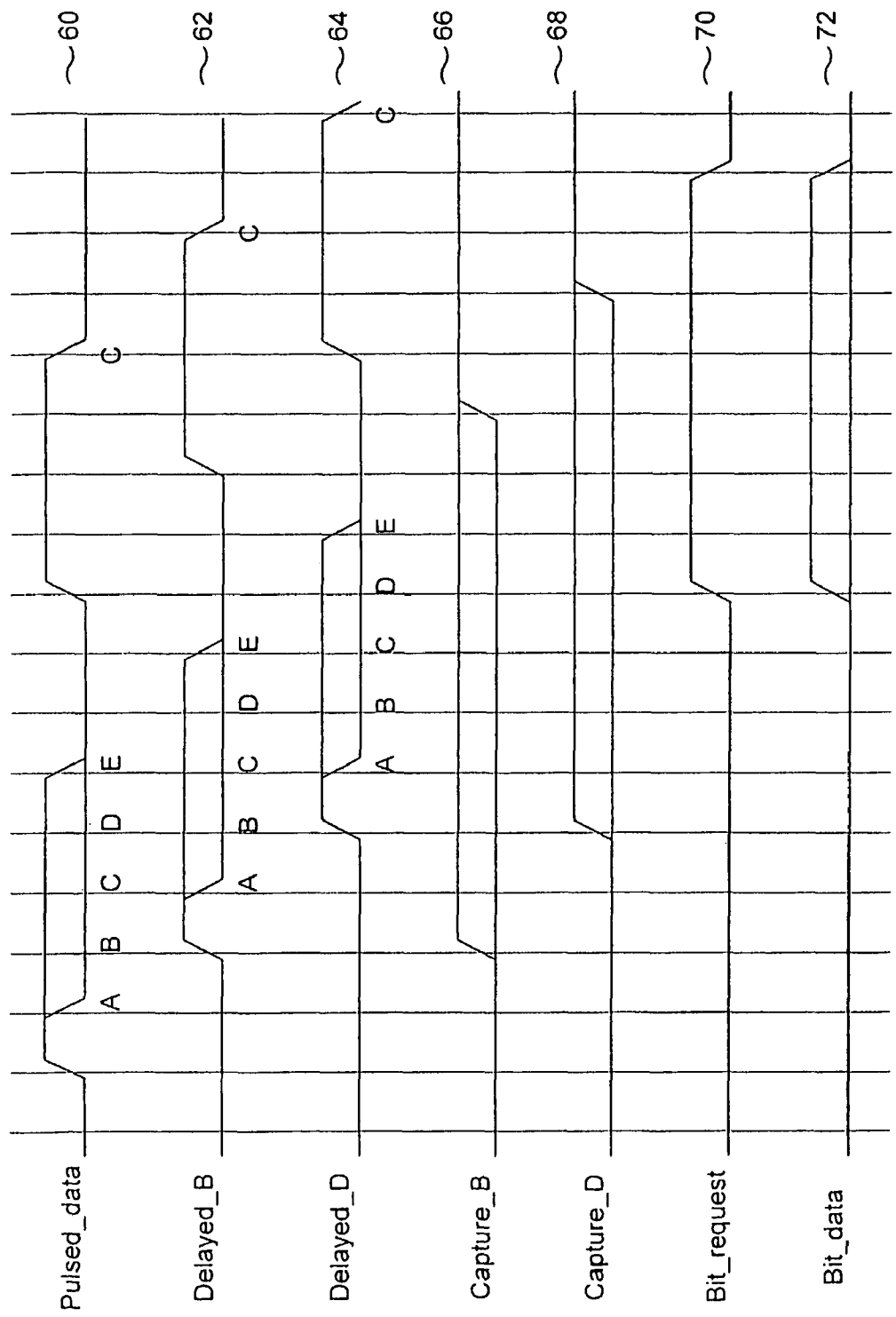
FIG. 4 shows data and timing signals recovered from the encoded signal of FIG. 3.

The programmable digital delay blocks 82 and 84 provide measuring gauges in order to determine the timing of the pulsed_data signal. The output of a first delay block 82 is at time B. Signal 62 shown in FIG. 4 illustrates the signal on line 98 output of PDD block 82. As shown by signal 62, the rising edge of this signal is aligned with position B of the pulsed_data signal. In order to provide this delay, control lines Mag (6) to Mag(0) are used to control delay elements in the PDD blocks 82 and 84 in a similar fashion to the previous example. However, in the PDD 82 and 84, the values on the control lines to each PDD 82 and 84 will usually be fixed so that the delay selection provided by these blocks remains constant.

In order to give a delay at time B, control signals Mag(3) to Mag(0) will be asserted high, and the remaining control signal asserted low. The output of the PDD block 82, delayed to time B, is provided to the PDD block 84. PDD block 84 outputs the pulsed_data signal after a delay to time D. Control signals Mag (1) to Mag (0) are asserted on lines 96 at the input to PDD 84 in order for PDD 84 to have the required delay.

As explained above, the pulsed_data signal, as shown in FIGS. 2 and 4, has three possible positions of the falling edge at times A, C, or E. The pulsed_data signal will arrive on line 80 of the decode block shown in FIG. 5. Consider sampling the pulsed_data at positions B and D respectively. If the values sampled at B and D are both low, then the falling edge must be at position A. If the values sampled at B and D are high and low respectively, then the falling edge must be at position C. If the values sampled at B and D are both high, then the falling edge must be at position E.

According to the encoder, described above, position A represents a valid data bit 0, position C represents no valid data, and position E represents a valid data bit 1. It can be seen that for valid data, sampled values at B and D are either both high, or both low; and if both values at B and D are high or low, the data value can be extracted by looking at either sample. In the embodiment shown in FIG. 5 the sampled value at B is used to extract the data bit. When there is no valid data, then the values sampled at B and D are different, being high and low respectively; hence the data valid signal bit_request can be extracted by the logical exclusive NOR function. Alternatives allow such logic extraction to be automatically optimised and could implement any boolean equivalent. Again, alternatives of the sampling points and boolean logic would allow for alternative numbers of falling edge positions, numbers of bits encoded and alternative coding schemes.

In the preferred arrangement, the sampling mechanism to capture the value at position B is to clock the value of the pulsed_data 80 at the D input of flip-flop 88, using a clock edge at position B. The clock edge is simply created by delaying the pulsed_data 80 by passing it through PDD 82 with appropriate settings on its magnitude inputs 94. The output of flip-flop 88 on line 102 is the value sampled at position B. This signal, is shown in FIG. 4 labelled Capture_B 66. Likewise, the sampling mechanism to capture the value at position D is to clock the value of the pulsed_data 80 at the D input of flip-flop 86, using a clock edge at position D. This clock edge is created by further delaying the delayed_B 98 by passing it through PDD 84 with appropriate settings on its magnitude inputs 96. The output of flip-flop 86 on line 104 is the value sampled at position D. This signal is shown in FIG. 4 labelled capture_D 68. The extracted bit_request 106 is the output of the exclusive-NOR gate 90, with inputs capture_B on line 102 and capture_D on line 104. The capture_B output from flip-flop 88 on line 102 is the extracted bit_data signal, shown as signal 72 in FIG. 4.

As described previously, the programmable delay lines in the encode and decode blocks are preferably programmable digital delay blocks. Particularly advantageous programmable digital delay blocks will now be described with reference to FIGS. 7 to 12.

The programmable digital delay circuits described below, and variations of the same, are not limited to use in encode or decode circuits as described above, but could be used in a multitude of circuits in which a delay is required.

Figure 7:
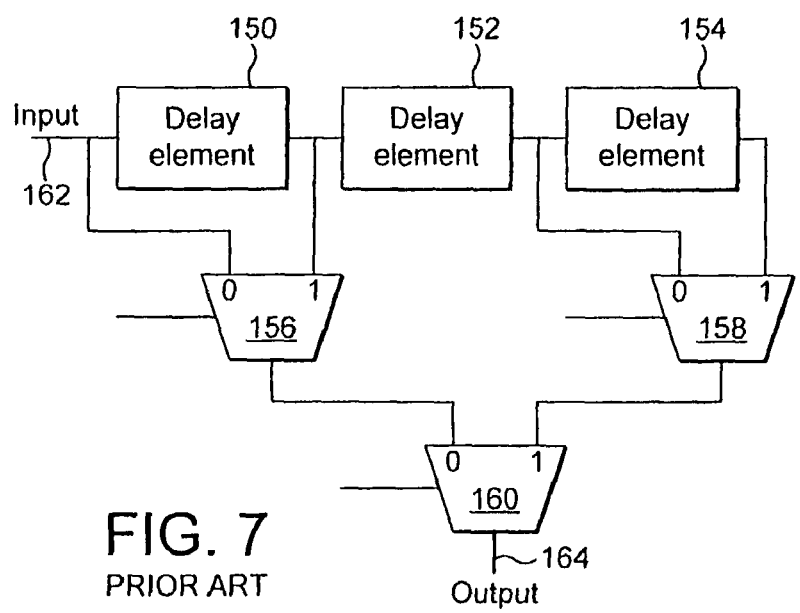
FIG. 7 shows a delay line and multiplexer tree.

FIG. 7 shows a known delay line and multiplexer tree that could be used as the programmable delay in embodiments of the encode and decode circuitry described above, however this circuit has a number of limitations as will now be explained. These limitations represent general limitations of this type of circuit, irrespective of its application.

The delay line comprises a number of delay elements 150, 152 and 154 connected in series. Each delay element introduces a certain delay into a signal input to it. The nominal delay, for a silicon chip manufactured at a specific point between the process corners, at a specific supply voltage and at a specific temperature, could be for example 100 ps. In theory this would allow the step size between each possible delay from the delay line to be in region of 100 ps, however in practice, due to the structure of the multiplexer tree shown in FIG. 7, the steps are likely to be far more varied, even before variations in process, voltage and temperature are taken into account.

The multiplexer tree for selecting different delayed signals from the delay line for output will now be described. The input and output of the first delay element 150 are connected to the two inputs of a multiplexer 156. The inputs and outputs of delay element 154 are connected to the two inputs of multiplexer 158. The output of multiplexers 156 and 158 are connected to the two inputs of a multiplexer 160. Each of the multiplexers has a control input for controlling which of the input signals will be connected to each output. By controlling the control inputs to multiplexers 156, 158 and 160, the signal at any point in the delay line can be selected for output. In practice, such a delay line would comprise many more delay elements and multiplexers, however only a limited number have been shown for clarity.

The delay line circuitry of FIG. 7 has a number of disadvantages. One major disadvantage is the lack of monotonicity at the output. This means that the output does not always show an increasing delay as the number of delay elements selected increases. For example, the output from delay element 150 may not provide a shorter delay time than the output of delay element 152. This is because each of the multiplexers in the circuit also add delay to the signal, and depending on the route that the signal is directed to the output, the delay added by these multiplexers may be greater or smaller. In other words, the delay added to the output of delay element 150 by multiplexer 156 and 160, could be greater than the delay added to the output of delay element 152 by multiplexers 158 and 160. In some situations, this may result in the delay when the output is taken from the output delay element 150 being longer than the delay when the output is taken from the output of delay element 152. This is obviously disadvantageous, as absolute accuracy is not achievable without tuning the delay line. Furthermore, as there is not a monotonic relationship between the number of delay elements selected and the delay at the output of the delay line, errors may occur when delay values are selected.

Figure 8:
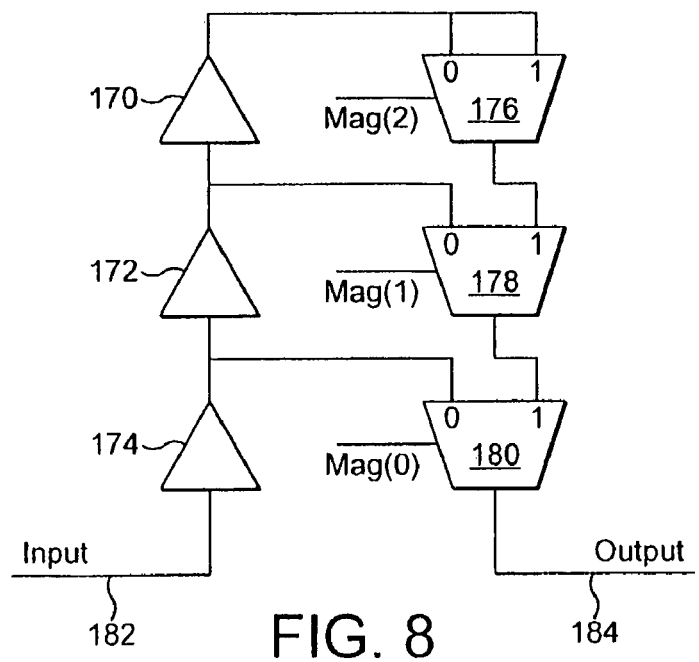
FIG. 8 shows a purely digital programmable delay line according to one embodiment of the present invention.

FIG. 8 shows an improved programmable digital delay line. The input to the delay line on line 182 is connected to a number of delay elements 170, 172, 174 which are connected in series. Three multiplexers are provided, which are labelled 176, 178, 180.

Each multiplexer has two inputs, labelled '0' and '1'. If the control signal to a multiplexer is a '0', the '0' input will be selected. If the control signal is a '1', the '1' input will be selected.

The '0' input of each of the multiplexers 170 to 174 is connected to a different point on the delay line. For example, the '0' input to multiplexer 180 is connected to the output of delay element 174. In the case of the last multiplexer in the line, which in this case is multiplexer 176, both of its two inputs are connected to the output from the last delay element in the line, delay element 170. The second input to each of the other multiplexers in the circuit is connected to the output of the previous multiplexer. For example, the '1' input to multiplexer 178 is connected to the output of multiplexer 176. The '1' input to multiplexer 180 is connected to the output of multiplexer 178. In this circuit, the output of multiplexer 180 on line 184 provides the output of the delay line.

Operation of this delay line circuit is as follows. Each of the multiplexers 176 to 180 has a control input, and these are labelled Mag(2) to Mag(0) respectively. If multiplexer 180 is controlled to output the signal received at its '0' input, the signal of the output of delay element 174 will be selected for output. In this case the overall delay at the output 184 would be equal to the delay of delay element 174, and the delay added by multiplexer 180. If however, multiplexer 180 is controlled to output the input received at its '1' input, and multiplexer 178 is controlled to output the input received at its '0' input, the signal at the output of delay element 172 will be connected via multiplexers 178 and 180 to the output 184. In this case, the total delay to the input signal present at the output on line 184 would be equal to the delay added by delay elements 174 and 172 and the delays added by the multiplexers 178 and 180. This will always be greater than the delay when only one delay element is selected. Thus in this circuit, monotonicity is always maintained, as the more delay elements that are selected, the greater the delay at the output.

It will be obvious to those skilled in the art that although only three delay elements and three multiplexers have been shown in this circuit for clarity, in practise the number of delay elements and multiplexers could be any required number, for example 500 or more. These would be provided in the series, connected in a similar fashion to delay 172 and multiplexer 178.

The minimum selectable delay in the circuit of FIG. 8 will be when only delay element 174 and multiplexer 180 are selected. If delay element 174 is a very small delay, then this smallest delay can be a lot smaller than smallest delay selected by the multiplexer tree.

Another advantage of the circuit layout in FIG. 8 is that the delay line may be positioned relatively freely on the chip in whatever layout is required by the chip designer. The delay elements and multiplexers could be arranged in one long line, or alternatively they could be arranged in a zig-zag. In either case, the performance of the delay line would not be affected.

Figure 9:
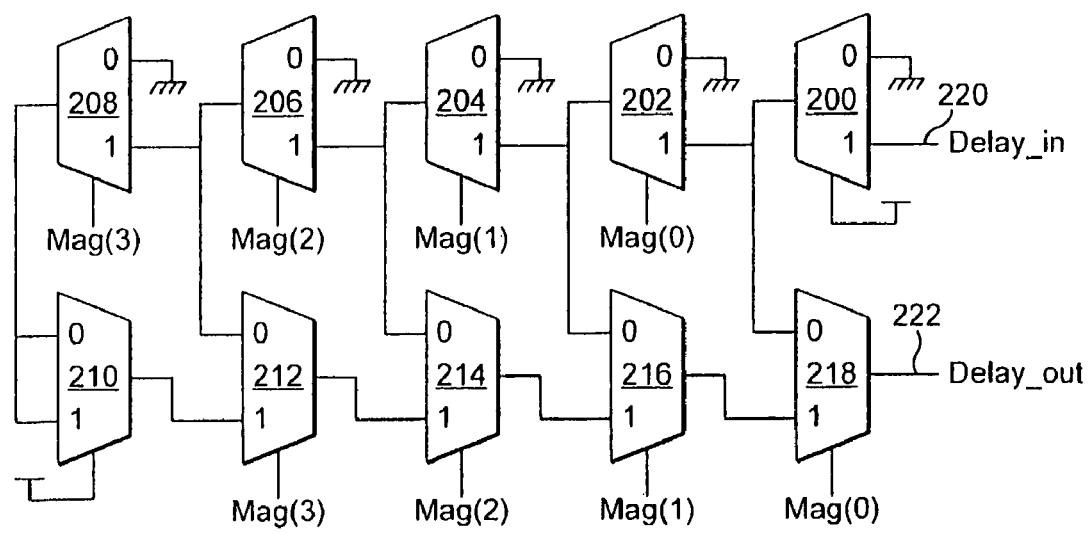
FIG. 9 shows a programmable digital delay line according to another embodiment of the present invention.

FIG. 9 shows an alternative circuit for the digital programmable delay block. In this embodiment the delay values are provided solely by multiplexers. The circuit comprises nine multiplexers, each with two inputs. A first five multiplexers are labelled 200 to 208, and each of these multiplexers has its 0 input connected to ground. The delay input on line 220 is connected to the one input of multiplexer 200. The '1' input of each of the other multiplexers 202 to 208 is connected to the preceding multiplexer. For example, the '1' input of multiplexer 202 is connected to the output of multiplexer 200. The output of multiplexers 200 to 208 are also connected to the '0' input of respective multiplexers 218 to 210. In the case of multiplexer 210, the output from multiplexer 208 is connected to both of its inputs. The '1' input to each of multiplexers 212 to 218 is connected to the output of the preceding multiplexer. For example, the output of multiplexer 216 is connected to the '1' input of multiplexer 218. The output of multiplexer 218 provides the delay by an output on line 222.

Multiplexers 202 and 218 in FIG. 9 are controlled by a control signal Mag(0). This control signal corresponds to the Mag(0) control signal provided to the PDD blocks 44, 82 and 84 in the encoder and decoder. Likewise, a control signal Mag(1) controls multiplexers 204 and 216, a control signal Mag(2) controls multiplexers 206 and 214, and a control signal Mag(3) controls multiplexers 208 and 212. In the PDD blocks 44, 82 and 84 of the encoder and decoder, there would be 16 multiplexers in the delay lines, and 7 control signals Mag(0) to Mag(6) for controlling them, however, for the sake of clarity, in order to illustrate the operation of the PDD, the smaller delay line of FIG. 9 will be referred to.

Figure 10:
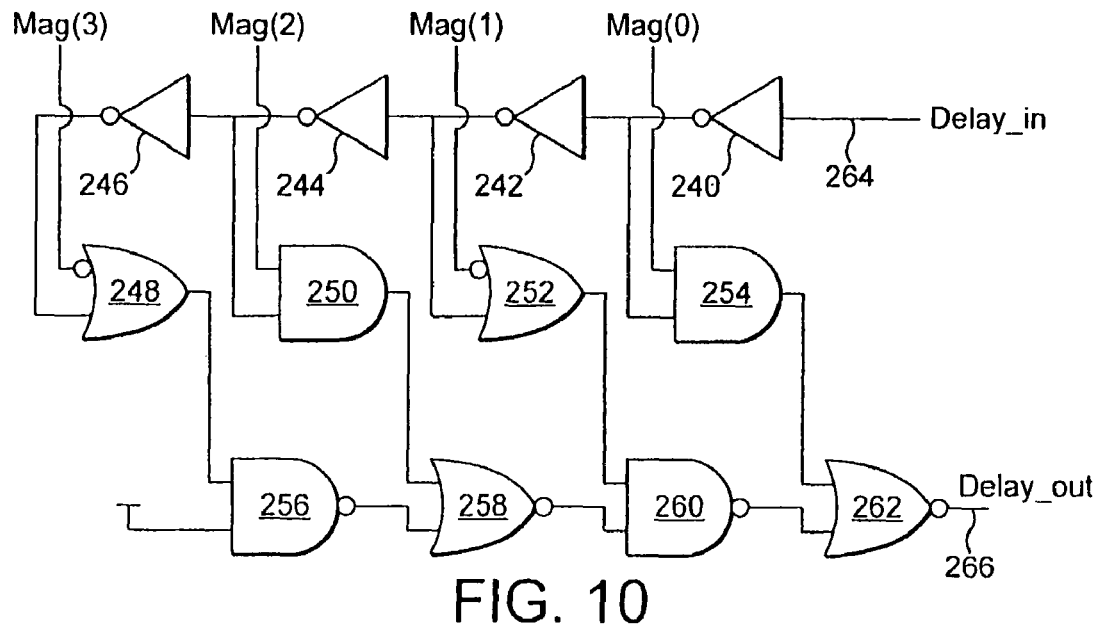
FIG. 10 shows another alternative embodiment of a programmable digital delay line of the present invention.

The delay line of FIGS. 9 and 10 permit a rapid reconfiguration mechanism. This allows a first long pulse to be quickly followed by a second pulse, where the reconfiguration time $T_R$ between the second edge of the first pulse and the first edge of the second pulse can be considerably shorter than the width of the first pulse. More specifically, when the control inputs mag(n) to the delay line are changed, all of the control inputs above the desired new delay are set at zero, and this zero causes all those elements to be reset, thus any vestige of previous activity is cleared out from the higher order elements. In FIG. 9, the ground connection on the "0" input of the multiplexer ensures that higher order elements contain zeros: there are no floating "1"s.

This is particularly useful when used to generate pulses of differing widths representing different data values. To clarify, suppose the master clock runs at 125 MHz with a clock period of 8 ns. Referring to line 60 of FIG. 4, that would put the rising edges at 0 ns and 8 ns, and the possible falling edges A, C, E at 1 ns, 3 ns and 5 ns respectively. Using a conventional delay, if the E pulse width was used, then after 5 ns the delay line has filled with 1's and this causes the falling edge E. Then the 1's must be cleared from the conventional delay, and this would take a further 5 ns, making the conventional delay ready for reuse after 10 ns. Thus the conventional delay could not be safely operated with an 8 ns period. Rapid reconfiguration overcomes this problem, and allows the delay to be reused immediately, though for practical purposes consider this at 6 ns.

Operation of the delay line in FIG. 9 will now be described, with reference to the example given in FIG. 2. As explained above, after the second rising edge of the pulsed_data signal 26, the PDD block 44 is programmed to provide a delay such that the falling edge of the pulsed_data signal is controlled to occur at time 'A' or 'E', depending on whether the data bit to be transmitted is a '0' bit or a '1' bit. Assuming that the data bit is a '0' bit, control signals Mag(2) to Mag(0) will be asserted high by the logic block 42, and the remaining control signals will be low. This would imply operation of the delay line in FIG. 9 as follows.

The input to the delay line on line 220 will be the rising edge of the pulsed_data signal on line 38. Due to the assertion of control signals Mag(2), Mag(1) and Mag(0), multiplexers 202, 204, 206, 214, 216 and 218 are controlled to output the signal at their '1' input. The remaining multiplexers are controlled to output the value at their '0' input. Therefore the signal at the input to the delay line will pass to the output via multiplexers 200, 202, 204, 206, 212, 214, 216 and 218. Each of these eight multiplexers will delay the signal by the fixed delay value between their input port and their output port. The overall delay will mean that rising edge at the output on line 22 will occur just before time 'A', such that the falling edge of the pulsed_data signal occurs at time 'A'.

Other delays by in PDD block 44 will be generated in a similar fashion. The greater the number of control signals that are asserted high, the greater the number of multiplexers in the delay line path, and the greater the delay at the output.

Advantages of the circuit of FIG. 9 is that all elements have same load, and also any unselected higher order gates contain only 0's, so there are no floating 1's in the unselected elements.

Advantageously, using only multiplexers as shown in FIG. 9, the delay increment between selectable delays can be reduced. In alternative embodiments, the top line of multiplexers 200 to 208 could be replaced by other gates to make the element delay even smaller.

Furthermore, as with the circuit layout in FIG. 8, the circuit of FIG. 9 has the advantage that the delay line may be positioned relatively freely on the chip in whatever layout is required by the chip designer. The multiplexers could be arranged in one long line, or alternatively they could be arranged in a zig-zag.

In an alternative to the circuitry of FIG. 9, both inputs to alternate pairs of multiplexers or the outputs from alternate pairs of multiplexers could be inverted. This is because inverting gates generally provide a smaller delay, and therefore smaller steps between delays can be achieved. For example, the 0 and 1 inputs to multiplexers 200, 204, 208, 210, 214 and 218 could be inverted. By inverting inputs to pairs of multiplexers, the result at the output of the delay line will not be inverted. FIG. 10 shows yet an alternative embodiment of the programmable digital delay block in the decoder or encoder. The delay line input signal is received on line 264. This is connected to a number of inverters 140 to 146, connected in series. The output from inverter 240 is connected to one of the inputs of a two input AND gate 254. The second input to AND gate 254 is connected to control signal Mag(0).

The output of inverter 242 is connected to one of the two inputs of a two input OR gate 252. The other inverted input to OR gate 252 is connected to control signal Mag(1). The output from inverter 244 is connected to one of the two inputs of AND gate 250. The second of the inputs to AND gate 250 is connected to control signal Mag(2). The output of inverter 246 is connected to one of the two inputs of a two input OR gate 248. The other inverted input to OR gate 248 is connected to control signal Mag(3).

The output from OR gate 248 is connected to a first input of two input NAND gate 256. The second input to NAND gate 256 is connected to high, (the positive rail). The output from second AND gate 250 is connected to one of two inputs of NOR gate 258, the second of the inputs to NOR gate 258 coming from the output of NAND gate 256. The output of OR gate 252 is connected to the second NAND gate 260. The second input to NAND gate 260 is connected to the output of NOR gate 258. The output of first AND gate 254 is connected to the first input of a two input NOR gate 262. The second input to NOR gate 262 is connected to the output of NAND gate 260. The output of NOR gate 262 on line 266 is the delay line output.

The operation of the circuit in FIG. 10 is similar to the operation of the circuits in FIGS. 8 and 9. If the first control signal Mag(0) is asserted, and the remaining control signals are low, then the output of delay line will be the signal at the output of inverter 240 connected via AND gate 254 and NOR gate 262 to the output line 266. This will give a first delay. If on the other hand the control signals Mag(0) and Mag(1) are both asserted high, the remaining control signals are asserted low, then the output of a delay line will be the output from inverter 242, connected to the output line 266 via OR gate 252 and NAND gate 260 and NOR gate 262. Thus the more control signals that are asserted, the greater the delay at the output of the delay line. In this embodiment the combination of inverters, OR, NOR gates, AND gates and NAND gates ensures that the delay line output will always be only a delayed version of a delay line input, irrespective of which path is selected for the delay line output.

The circuit of FIG. 10 has the following advantages. Inverting gates generally provide a smaller delay than non-inverting gates. Only one of the non-inverting gates 248 to 254 in this circuit will ever be in the delay line. Therefore, the delay increment from one selection to the next will only ever be equal to the delay of an inverter and one inverting gate. Furthermore, as with the circuits of FIGS. 8 and 9, the delay line may be positioned relatively freely on the chip in whatever layout is required by the chip designer.

Note that it is likely that one of the two inputs of the NAND and NOR gates 256 to 262 in FIG. 10 is faster than the other. In order to minimise the delay increment between selections, the faster input should be used for the through signal, that is the signal from the next NAND or NOR gate in the sequence.

Figure 11:
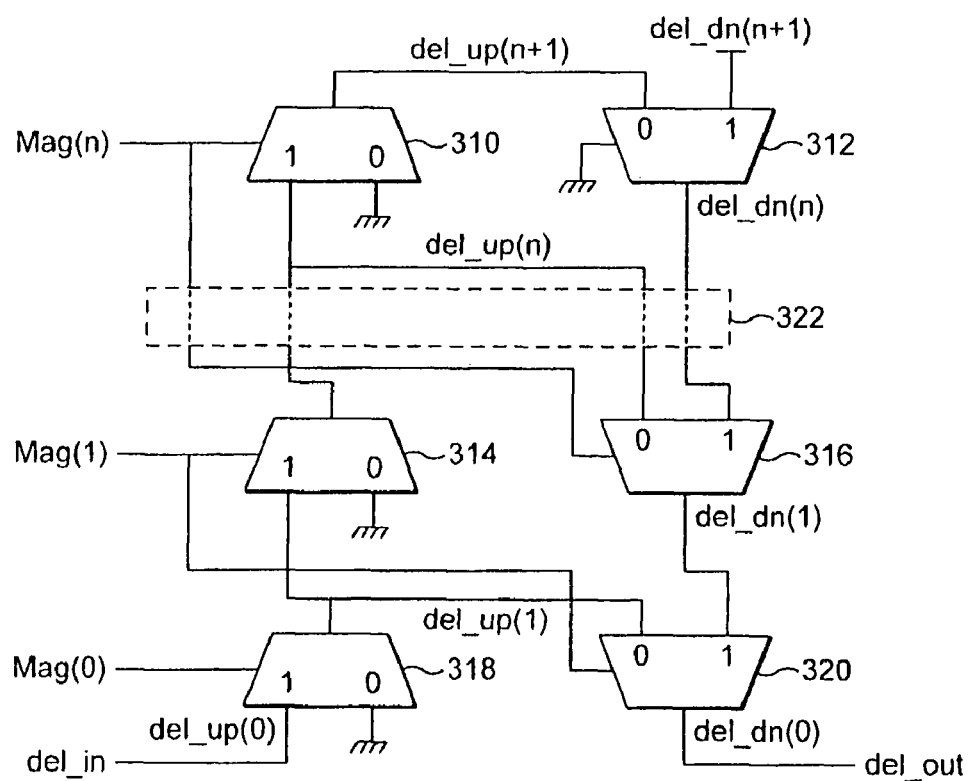
FIG. 11 shows another embodiment of a programmable digital delay according to the present invention.

FIG. 11 shows a more general case of a PDD similar to the circuit of FIG. 9. Six multiplexers 310 to 320 are shown, and connections for multiplexers 310 to 316 are similar to connections of multiplexers in FIG. 9, and will not be described again. In the circuit in FIG. 11, region 322 has been shown where further multiplexers can be inserted into the sequence. Multiplexers 310 and 312 show the end case, in which these are the nth pair in line.

A difference with this circuit is that when none of the control signals Mag(0) to Mag(n) are asserted, the output will be ground, as the first multiplexer in the sequence 318 has its '0' input connected to ground. In other circuits this combination of signals may have provided the smallest delay.

Figure 12:
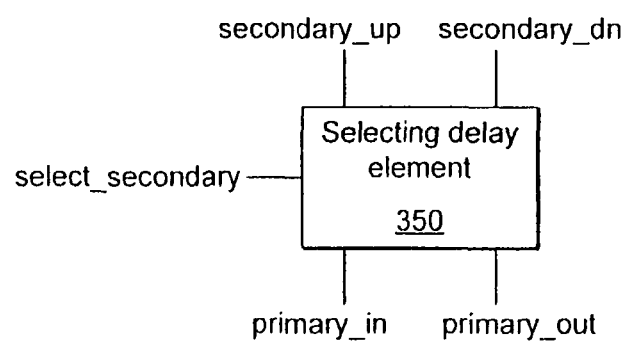
FIG. 12 shows one delay element according to an embodiment of the present invention.

FIG. 12 shows a selecting delay element block 350 and represents the general concept of the PDD line. The circuitry in this block is a delay element and could be circuitry according to any of the embodiments described above. For example, it could be a pair of multiplexers as shown in FIGS. 9 and 11, a delay element and multiplexer as shown in FIG. 8, or inverter, OR, NAND gate or inverter AND, NOR gate combination shown in FIG. 10. In any case, one or more of these general delay element blocks can be connected in sequence. The primary_in and secondary_up lines represent the outward path, and the secondary_dn input and primary_out line represent the return path. The select_secondary line is the control input to the delay element that allows the next element in line to be selected to be included in the delay path.

As mentioned above, PDD circuits described above are not limited to use in the encoder or decoder circuits. Another application for the programmable digital delay PDD will now be described in which the PDD is used as a programmable delay line PDL. This circuit can be used for generating timing signals for retiming data in an SDRAM DRR interface as described above. Rapid reconfiguration is also useful for the SDRAM application. One earlier analogue solution has 400 taps and this is capable of generating a longest delay of 3.5 ns in the best case PVT (process, voltage and temperature). But in the worst case PVT, this could easily be well over 10 ns. So if a desired delay is 2.5 ns for a quarter period delay of 10 ns (for 100 MHz) then this analogue solution could be in difficulty. Also, in a conventional digital delay, although, for example, the variability might be 2.5 ns plus or minus 0.1 ns, the fact that the delay is capable of over 10 ns (to cope with the PVT and specification range) means that there might be vestige 1's in the higher order elements of the PDD which could get accidentally switched in as the selection was varied. The rapid reconfiguration mechanism described herein avoids that.

Figure 6:
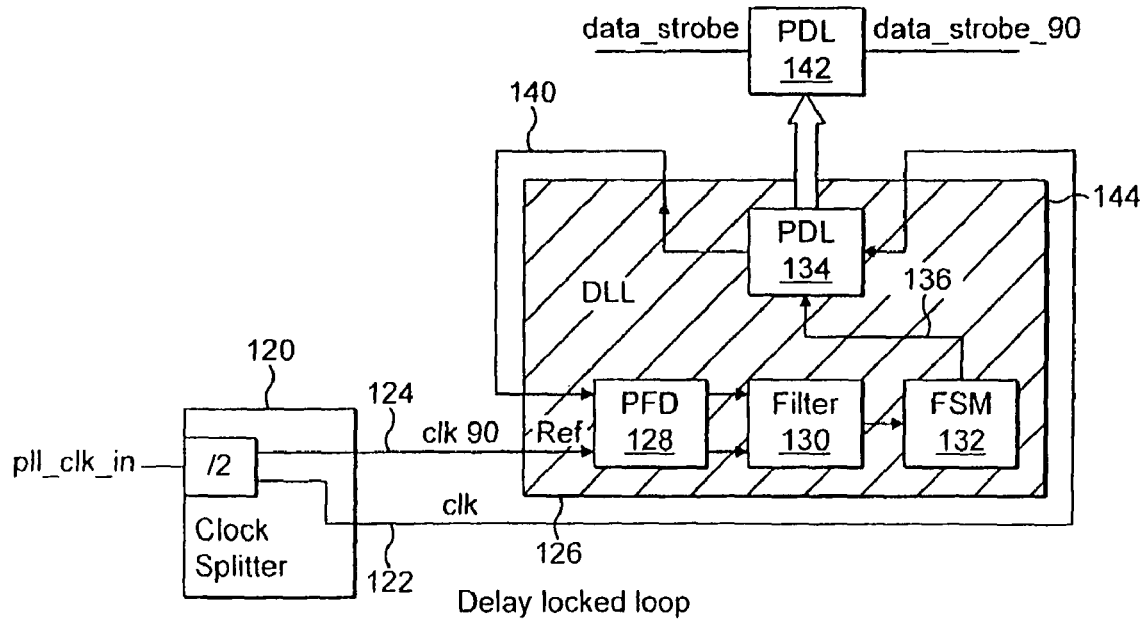
FIG. 6 shows a delay locked loop in which embodiments of the present invention can be incorporated.

As shown in FIG. 6 a delay locked loop comprises a phase frequency detector 128, filter 130, FSM (finite state machine) 132 and programmable delay line 134. Clock signals are provided to the DLL block 144 via lines 122 and 124 from a clock splitter block 120. Clock splitter block 120 receives a clock input from a phased locked loop (not shown in FIG. 6) and splits this clock signal into a clock signal on line 122 which is in phase with the input clock and a clock signal CLK 90 on line 124 which is shifted by 90 degrees. CLK 90 is used as a reference signal to the PFD 128. The output from the programmable delay line 134 on line 140 is also connected to an input of the PFD 128. The output of PFD block 128 is connected to filter 130. The output of filter 130 is connected to the input of finite state machine 132. The output of the FSM 132 is connected by line 136 to the programmable delay line 134. Programmable delay line 134 also receives the clock signal on line 122 from the clock splitter block 120.

The DLL circuit 144 operates as a closed loop, so that any inaccuracies in the programmable delay line are removed. The programmable delay line 134 is programmed to provide a 90 degree delay to the input clock on line 122. This delayed clock is then output on line 140, and fed back to the input of the PFD block 128. The PFD block 128 compares this delayed clock with the reference clock which is the 90 degrees shifted clock output from clock splitter block 120. Any variations are filtered by filter 130, and cause the finite state machine 132 to adjust the output to the PDL block 134 on line 136. Adjustments will occur until the output of the PDL block 134 is configured to provide a 90 degree phase shift in the input clock signal. The configuration of PDL 134 can then be used to control other PDLs such as PDL 142.

The programmable delay line 134 is a PDD as described herein. The control signal 136 comprises a number of control lines for controlling the number of delay elements in the PDD as described herein, such that the delay matches the 90 degree delay on input 124. This control signal can then be used to control other PDL in the circuit in order to accurately delay signals and generate required timing signals.

When such a PDL is used as part of a DLL, the feedback loop relies on monotonicity as hunts for the balancing point. To illustrate, if the phase of the controlled output 140 is detected as early compared to the reference 124, then the FSM increments the program delay value 136; conversely if the phase is detected as late, FSM decrements the program delay value. The underlying assumption is that in increase in program delay value results in an increase in delay and vice versa, that is, there is a monotonic relationship between the program value and the delay. If an increase in program value results in a decrease of delay, as would be the case in some circuits as outlined above, then the FSM would be given misleading information and might incorrectly lock at such a discontinuity.

Figure 13:
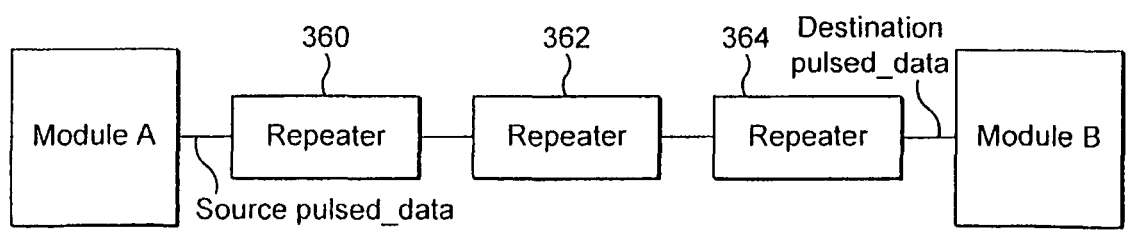
FIG. 13 shows a series of repeaters used for communication between two modules.

Reference will now be made to FIG. 13, which shows the use of repeaters between two modules A and B on a chip. As with the circuit of FIG. 1, these modules could alternatively be on separate chips. If the track between modules A and B is relatively long, then high drive strengths will be required in order to overcome capacitance in the line. Lines with high drive strengths risk being cross-talk aggressors, meaning that they interfere with other lines on the chip. The solution is generally to limit the maximum length on any one track.

A problem with limiting track lengths is that the maximum length is small in comparison to the distances between logic blocks on an SoC, or between SoCs. This can be solved by placing "repeaters" along the length of the connection between its endpoints, such that the distance between the repeaters is less than the maximum length. As shown in FIG. 13, in this circuit three such repeaters, labelled 360 to 364, are necessary between modules A and B.

For a parallel bus, significant timing margins need to be provided to allow for the overall delay through the required number of repeaters, and the maximum variation in delays between all paths. The clock frequency is generally reduced to allow for these delays. Alternatively, a clock can be routed alongside the data so that the overall delay is eliminated, however, the variations in delay across the many tracks will still need to be taken into account. Furthermore, in this situation it would also be necessary to resynchronise the data, which impacts performance due to the latency overhead of resynchronising data.

Serial communication links overcome some of the above problems, however there will still be variations in delay between a clock signal and the data line that have to be dealt with.

By implementing a serial connection as described above, using pulsed_data on a Pulsed Serial Link, a number of these problems are overcome, as will now be explained with reference to FIG. 14.

Figure 14:
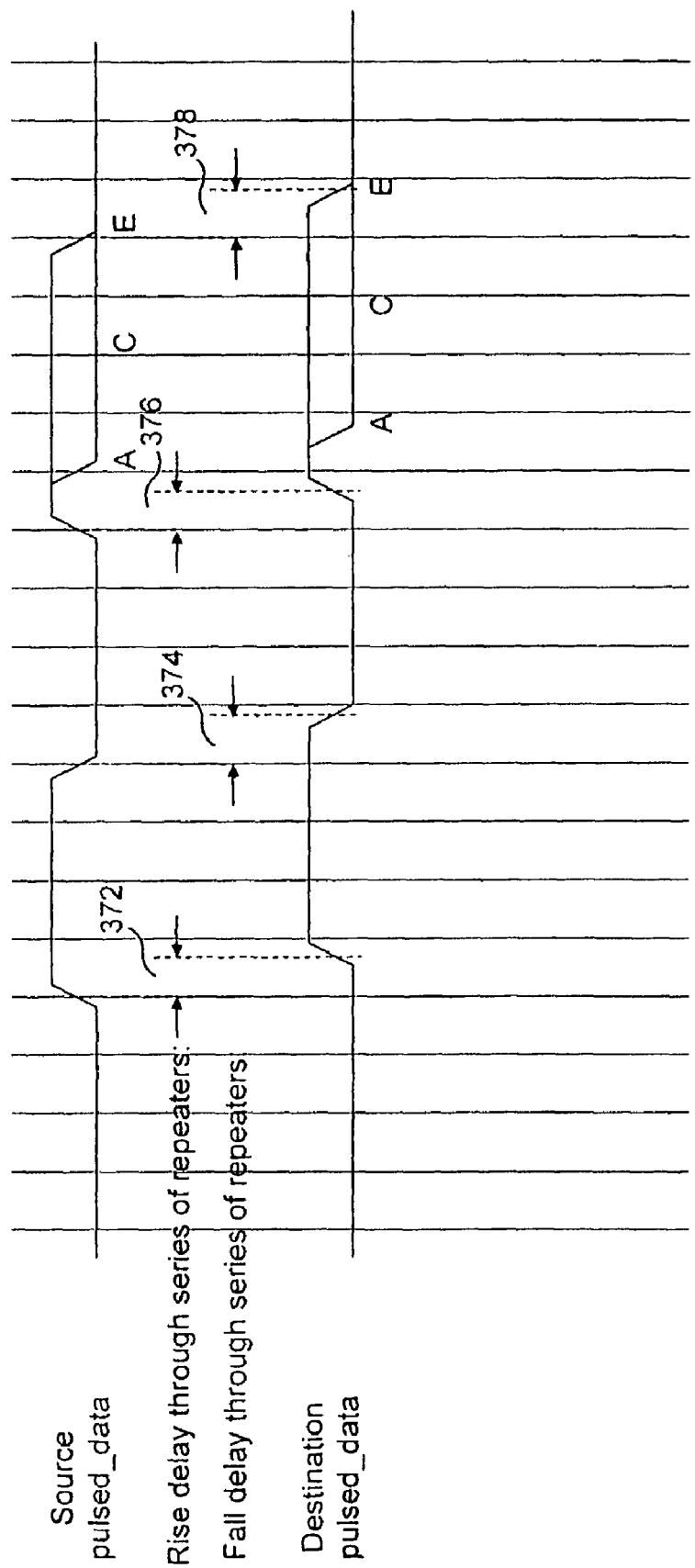
FIG. 14 shows timing of signals in FIG. 13 according to one example.

FIG. 14 shows examples of a source pulsed_data signal as it leaves module A, and a destination pulsed_data signal that arrives at module B. The rising and falling edges of the pulsed_data signal will be delayed through the three repeaters and the line, but not necessarily by equal amounts. Delays 372 and 376 shown in FIG. 15 are the delays to the rising edges. Delays 374 and 378 shown are the delays to the falling edges.

Importantly, the absolute delay to the pulsed_data signal will not affect the ability to decode the signal, as it is only the timing between the positive edge to the falling edge at A C or D that contains the data. The absolute delay for a given edge will be affected by the following PVT (process, voltage, temperature) parameters, which, as indicated, will be largely irrelevant when the modules are on the same silicon:

Process (P) variation will be slight because the link and blocks are on the same silicon;

Voltage (V) will be constant across the whole of the chip, apart from locally induced noise effects;

Temperature (T) will be constant because the all of the silicon is at the same temperature.

The main contributor to variations in delay (for a given edge) is locally induced noise effects. These are small compared to PVT variations. Such variations do need to be taken into account in the overall timing analysis of a pulsed serial link. However, it should be noted that the increase in noise margin does not increase linearly with the number of buffers (statistical analysis required).

Therefore there is no limit on the physical distance between communicating blocks, as there is no constraint in the number of repeaters that may be used and the absolute delay that may be added. Furthermore, the clock signal does not have to be limited to meet the timing constraints described above, and therefore the bandwidth is not compromised by the overall distance of the link.

According to embodiments of the pulse data circuitry described above, the difference in delay between opposite polarity edges (the difference between 372 and 374) is largely irrelevant. However, it is important that the delay from each positive edge to the next positive edge is tightly controlled, and also, independently, the delay between each negative edge and the next is tightly controlled.

The design of logic to implement a repeater would be straightforward for one skilled in the art. It does not require a clock (or reset) to be connected to the repeater. The embedded data is not decoded and then reconstituted, so the repeater design is independent of any particular coding scheme. There are no special power supply or other analogue requirements, and repeaters can be instanced by automated tools.

The application hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A method of delaying successive first and second input signal edges by first and second different selectable time periods using a programmable delay line, the method comprising:
providing a control signal to each of a plurality of delay elements associated with said programmable delay line, the control signal selectively being in a first logic state or a second logic state, wherein in a first logic state the delay element selects an input from an adjacent delay element thereby to select the adjacent delay elements as part of a set of delay elements introducing said selectable time period and in a second logic state the adjacent delay element is not selected in the set;
setting the control signals for a first number of adjacent delay elements to the first logic state to introduce the first selectable time period,
wherein the control signals for the delay elements in the sequence not in the first number are set to the second logic state; and
setting the control signals of a second number of adjacent delay elements to the first logic state to introduce the second selectable time period,
wherein the control signals for the delay elements in the sequence not in the second number are set to the second logic state and wherein a reconfiguration time between outputting the delayed first input signal and receiving the second input signal is less than the maximum delay introduced by the sequence of delay elements.

2. The method according to claim 1, wherein the second number is less than the first number and the reconfiguration time is less than the selectable time period introduced by the first number.

3. The method according to claim 1, wherein pulses of different width each represent a data value.

4. The method according to claim 1, wherein the first and second input signals are clock signals separated by a clock period and the reconfiguration time is less than half the clock period.

5. The method according to claim 1, wherein said delay is provided by an outward path and a return path for said input signal through said delay element, and
wherein with the control signal in the first logic state said outward path of said adjacent delay element is selected as an input of the selecting delay element.

6. The method according to claim 5, wherein the delay at said output equal to said selectable time period is provided by an outward path and a return path through said set of delay elements.

7. The method according to claim 1 further comprising:
inverting said first and second outputs of alternate delay elements in said sequence.

8. A programmable delay circuit comprising:
a programmable delay line arranged to delay successive first and second input signals edges by first and second different selectable time periods,
wherein said first and second successive input signal edges are received at an input of the delay line and said delay line outputs the delayed input signal edges,
wherein said delay line comprises:
a sequence of delay elements each introducing a delay, and
a selection circuit arranged to receive a control signal selectively being in a first or a second logic state,
wherein in a first logic state the delay element selects an input from an adjacent delay element thereby to select the adjacent delay element as part of a set of delay elements introducing said selectable time period and in a second logic state the adjacent delay element is not selected in the set, and
wherein the delay line resets the control signals from the first to the second logic state in a reconfiguration time between outputting the delayed first input signal edge and receiving the second input signal edge, which is less than the maximum delay introduced by the sequence of delay elements.

9. The programmable delay circuit according to claim 8, wherein the delay at said output equal to said selectable time period is provided by an outward path and a return path through said set of delay elements.

10. The programmable delay circuit according to claim 9, wherein the selection circuit comprises a multiplexer having a first input connected to receive an output from an adjacent delay element and a second input connected to the outward path of the same delay element.

11. The programmable delay circuit according to claim 9, wherein each delay element comprises a second multiplexer to reset the delay line, wherein the second multiplexer includes a reset input connected to a predetermined logic value.

12. The programmable delay circuit according to claim 11, wherein the predetermined logic value is zero.

13. The programmable delay circuit according to claim 8, wherein the selection circuit comprises a logic gate arranged to receive said control signal.

14. The programmable delay circuit according to claim 13, wherein said logic gate comprises at least one of:
an OR gate;
a NOR gate;
an AND gate; and
a NAND gate.

15. The programmable delay circuit according to claim 8, wherein each delay element comprises a first input, a second input, a control input, a first output and a second output, wherein the control signal at said control input controls which signal at said first and second inputs to select for output at said second output.

16. The programmable delay circuit according to claim 15, wherein the first and second outputs of alternate delay elements in said sequence are inverted.

17. The programmable delay circuit according to claim 15 wherein:
each delay element except the last delay element in said sequence are connected in sequence such that said first output is connected to the first input of the next delay element in the sequence;
said second input is connected to the second output of the next delay element in the sequence;
said last delay element in said sequence is connected such that its first output is connected to its first input; and
said first delay element in said sequence is connected such that its first input is connected to said input to the delay line, and its second output is connected to said output of the delay line.

18. The programmable delay circuit according to claim 8, wherein each delay element further includes a buffer.

19. The programmable delay circuit according to claim 8, wherein the clock edges supply the input signals.

20. A circuit to encode data as a series of pulses of differing widths, wherein each width represents a data value, the circuit comprising:
   a data source supplying said data value; and
   a delay line arranged to delay successive first and second input signal edges by first and second different selectable time periods,
   wherein said first and second successive input signals are received at an input of the delay line and the delay line outputs the delayed input signal edges,
   wherein said delay line comprises a sequence of delay elements each introducing a delay and a selection circuit arranged to receive a control signal, the control signal selectively being in a first or a second logic state,
   wherein in a first logic state the delay element selects an input from an adjacent delay element thereby to select the adjacent delay element as part of a set of delay elements introducing said selectable time period and in a second logic state the adjacent delay element is not selected in the set,
   wherein the delay line resets the control signals from the first to the second logic state in a reconfiguration time between outputting the delayed first input signal edge and receiving the second input signal edge, which is less than the maximum delay introduced by the sequence of delay elements, and
   wherein each selectable time period represents a pulse width and the reconfiguration time is less than the longest pulse width.

* * * * *